United States Patent [19]

Ono et al.

[11] Patent Number: 5,505,778
[45] Date of Patent: Apr. 9, 1996

[54] SURFACE TREATING APPARATUS, SURFACE TREATING METHOD AND SEMICONDUCTOR DEVICE MANUFACTURING METHOD

[75] Inventors: Tetsuo Ono; Susumu Hiraoka, both of Kokubunji; Sakae Saito, Tokorozawa; Kunio Harada, Hachioji; Mituhiro Tachibana, Fuchu; Shigeo Kubota, Saitama; Keizo Suzuki, Kodaira, all of Japan

[73] Assignee: Hitachi, Ltd., Tokyo, Japan

[21] Appl. No.: 730,078

[22] Filed: Jul. 15, 1991

[30]  Foreign Application Priority Data

Jul. 13, 1990  [JP]  Japan ................................... 2-184315

[51] Int. Cl.$^6$ ................................................. C23C 16/54
[52] U.S. Cl. ...................... 156/625.1; 118/715; 118/719; 156/345; 437/225
[58] Field of Search ................................... 437/225, 228; 118/715, 719; 156/345, 625

[56]  References Cited

U.S. PATENT DOCUMENTS 4,668,480   5/1987   Fujiyashu et al. ..................... 118/719

Primary Examiner—R. Bruce Breneman
Attorney, Agent, or Firm—Antonelli, Terry, Stout & Kraus

[57]  ABSTRACT

An apparatus for treating solid surface using a thermally excited molecular beam according to the present invention is capable of completely preventing flying of contaminant caused by a heating source to a sample. To achieve this, in the present invention, the heating source for exciting the molecules is hermetically separated from the sample. Alternatively, a container where the heating source is housed and a container where the sample is accommodated are separated such that a conductance between the two containers is sufficiently small. In this way, chemical reactions between the molecular beam of the reactive gas which is highly reactive and the heating source heated to high temperatures can be eliminated, and flying of the contaminant to the sample can thus be greatly reduced. As a result, flying of the contaminating substances caused by the heating source to the sample can be prevented, and reduction in the surface treating rate of the sample, caused by the contaminant, can be prevented.

73 Claims, 6 Drawing Sheets

SURFACE TREATING APPARATUS, SURFACE TREATING METHOD AND SEMICONDUCTOR DEVICE MANUFACTURING METHOD

BACKGROUND OF THE INVENTION

The present invention relates to a surface treating apparatus, a surface treating method and a semiconductor device manufacturing method. More particularly, the present invention relates to an apparatus for and a method of treating a solid surface using a thermally excited molecular beam.

In the surface treating method which uses a thermally excited molecular beam, a gas containing a halogen, such as $SF_6$, is heated by means of a furnace to excite rotational, translational and vibrating energies of molecules thereof (hereinafter, excitation of rotational, translational and vibrating energies of molecules being referred to as thermal excitation of molecules), and such a gas is injected into a vacuum to form a beam. That beam is used to treat a solid surface. Since the thermally excited molecules are highly reactive, the use of such a molecular beam in the etching of a solid surface, which is the manufacturing process of semiconductor devices, greatly increases the etching rate as compared with a case in which non-thermally excited molecular beams. Since the thermal energy level of the molecules is low as compared with the energy level of electrons or ions in a plasma, the solid is less damaged in this surface treating technique as compared with the conventional surface treating methods which use charged particles. Also, the adverse effect of the electric charges to the solid can be eliminated because the thermally excited molecular beam is the neutral particle beam. The surface treating techniques which use the thermally excited molecular beam have been disclosed in, for example, U.S. Pat. No. 4,901,667.

This conventional technique will now be described.

FIGS. 1 and 2 are similar to FIGS. 5 and 6 of U.S. Pat. No. 4,901,667. Referring first to FIG. 1, this surface treating apparatus includes a vacuum chamber 101, a sample base 103 for holding a sample 102, a leak valve 104 for introducing a gas 112, a gas heating means including a heat source 105 and a heating furnace 106, and a thin hole 107 for injecting the gas into a vacuum. In this apparatus, the heating means 105 is provided externally to the reaction chamber 101 in order to prevent radiation of heat and flying of the contaminant to the sample 102. The outer wall of the gas heating furnace 106 protrudes from the vacuum chamber, and this necessitates provision of a vacuum sealing 109 between the gas heating furnace 106 and the vacuum chamber 101. A flange 108 prevents the vacuum sealing 109 from making direct contact with the gas heating furnace 106. A cooling means 110 prevents thermal damage to the vacuum sealing. A connecting portion 111 facilitates replacement of the gas heating furnace 106.

However, in this method, the heating means is exposed to air and is easily oxidized, as stated in the specification of the above-described U.S. patent. In a case where the heating means uses a heater made of, for example, tungsten, tungsten is oxidized and thereby breaks easily when heated to high temperatures in the air.

FIG. 2 shows a structure which is an improvement on the apparatus shown in FIG. 1. In this structure, the heating means 105 is placed in a chamber 102 that can be evacuated in order to prevent flying of the contaminant and radiation of heat to the sample 102 as well as oxidation of the heating means. A partitioning plate 123 having holes 122 through which beams can pass is provided between the chamber 121 where the heating means is provided and the reaction chamber 101 so that both chambers can be exhausted separately although they cannot be hermetically separated from each other in a complete form.

SUMMARY OF THE INVENTION

The present inventors made experiments and found that the above-described conventional technique still suffered some drawbacks. That is, in the apparatus in which the partitioning plate is provided between the heating means and the sample, the present inventors discovered that the partitioning plate passed not only molecular beams but also contaminating substances, which hinder surface treating.

The following two points are considered as the cause of flying of the contaminant substances. Firstly, this phenomenon is caused by flowing of gas used in surface treating, such as halogen, into a chamber where the heating means is provided through the holes in the partitioning plate. Since halogen is highly reactive, it readily reacts with the heating means, such as a tungsten heater, and thereby creates a highly volatile product that can be a contaminant. The second cause is that the possibility that the contaminant flies directly to the surface of the sample is high in the structure shown in FIG. 2. Although the method of separating the sample from the heating means using a partitioning plate with holes is simple and assures easy maintenance, there is a portion of the surface of the sample which directly faces the heating means with respect to the relative arrangement among the sample, partitioning plate and heating means. This is illustrated in FIG. 3 which is an enlarged view of a nozzle and a sample 44. That the heating means 42 faces the sample surface 44 means that there is nothing which blocks passage of beams between a given point A on the surface of the heating means 42 and a given point B on the surface of the sample 44. At the degree of vacuum provided in this type of apparatus, the mean free path of molecules is in the order of several centimeters. Therefore, when no obstacle exists between points A and B, the contaminant passes through the holes in the partitioning plate 43 and directly reaches the surface of the sample, thus increasing the degree of contamination of the sample.

That is, since the energy level of thermally excited molecular beams used in the surface processing is low, as stated above, such a surface treating is very sensitive to the contamination of the surface as compared with the surface treating using a plasma having a high energy level. Therefore, the contamination preventing measures in the conventional techniques is not sufficient.

An object of the present invention is to provide a surface treating apparatus for treating a solid surface using a thermally excited molecular beam which is capable of sufficiently preventing the flying of contaminating substances caused by and from a heating source to a sample.

To achieve this object, the present invention provides a surface treating apparatus in which a heating means and a reaction chamber are completely hermetically separated from each other.

The present invention further provides in another aspect a surface treating apparatus which uses an improved partitioning plate so that the surface of a sample does not directly face the heating means.

In the case of an anisotropic processing of the surface of a sample, such as the etching of the sample, a molecular beam whose molecules are oriented in one direction must be made incident on the surface of the sample. Two methods are described below for forming a thermally excited molecular beam in the reaction chamber. In one method, a molecular beam is formed by providing a nozzle protruding into the reaction chamber and a heat source in the vicinity of the distal end thereof. In this method, a reactive gas is heated in the nozzle, and the excited reactive gas is ejected from the distal end of the nozzle to form a molecular beam. In the other method, a reactive gas located near the sample placed in the reaction chamber is heated by a heat source, and the molecules of the excited reactive gas are oriented in one direction using a collimator to form a molecular beam.

In the case of oxidation, deposition or cleaning of the surface of the sample, anisotropic treating is not required, and hence formation of a molecular beam is not necessary. Therefore, a nozzle or collimator for forming a molecular beam may not be necessary.

The heating means comprises an electric resistance heater, an infrared heater, a high-frequency heater or a laser beam heater.

When the heating means is hermetically separated from the reaction chamber, a highly reactive gas, such as halogen, does not flow into or near the heating means which is heated to high temperatures. Therefore, non-productive chemical reactions between the substance which forms the heating means and the reactive gas can be restricted, and contamination of the sample caused by the heating source can thus be prevented.

Even when the heating means is not hermetically separated from the reaction chamber, if the heating means does not face the surface of the sample, the contaminating substances collide against and are absorbed by the wall before reaching the surface of the sample, thus reducing the degree of contamination.

The present invention provides a surface treating apparatus which comprises a first means for supplying a reactive gas used for surface treating a sample to the sample, a second means for heating the first means, a third means for accommodating the second means in a first inner space, a fourth means for surface treating the sample in a second inner space, and a fifth means for supplying an inactive gas into the second inner space. The first and second inner spaces are hermetically separated from each other.

The present invention further provides a surface treating apparatus which comprises a first means for supplying a reactive gas used for surface treating to the sample, a second means for heating the first means, a third means for accommodating the second means in a first inner space, a fourth means for surface treating the sample in a second inner space, and a fifth means for evacuating the second inner space. The first and second inner spaces are hermetically separated from each other.

The present invention further provides a surface treating method which comprises the steps of (a) preparing a first means for supplying a reactive gas used for surface treating to the sample, (b) preparing a second means for heating the first means in a first inner space, (c) supplying an inactive gas into the first inner space, and (d) surface treating the sample in a second inner space which is hermetically separated from the first inner space.

The present invention further provides a surface treating method which comprises the steps of (a) preparing a first means for supplying a reactive gas used for surface treating to the sample, (b) preparing a second means for heating the first means in a first inner space, (c) evacuating the first inner space, and (d) surface treating the sample in a second inner space which is hermetically separated from the first inner space.

The present invention further provides a method of manufacturing semiconductor devices which comprises steps of (a) preparing a first means for supplying a reactive gas used for surface treating to the semiconductor device, (b) preparing a second means for heating the first means in a first inner space, (c) supplying an inactive gas into the first inner space, and (d) surface treating the semiconductor device in a second inner space which is hermetically separated from the first inner space.

The present invention further provides a method of manufacturing semiconductor devices which comprises the steps of (a) preparing a first means for supplying a reactive gas used for surface treating to the semiconductor device, (b) preparing a second means for heating the first means in a first inner space, (c) evacuating the first inner space, and (d) surface treating the semiconductor device in a second inner space which is hermetically separated from the first inner space.

The present invention further provides a surface treating apparatus which comprises a first means for supplying a reactive gas used to surface treat to the sample, a second means for heating the first means, a first space where the second means is accommodated, a second space where surface treating of the sample takes place, a third means for partially communicating the first space with the second space and for separating the first space from the second space at the other portions, a fourth means for shielding the second means from the second space, and a fifth means for supplying an inactive gas into the second inner space.

The present invention further provides a surface treating apparatus which comprises a first means for supplying a reactive gas used to surface treat to the sample, a second means for heating the first means, a first space where the second means is accommodated, a second space where surface treating of the sample takes place, a third means for partially communicating the first space with the second space and for separating the first space from the second space at the other portions, a fourth means for shielding the second means from the second space, and a fifth means for evacuating the second inner space.

The present invention further provides a surface treating apparatus which comprises the steps of (a) preparing a first means for supplying a reactive gas used for surface treating to the sample, (b) preparing a second means for heating the first means in a first inner space, (c) preparing a third means for partially communicating the first inner space with a second space where surface treating of the sample takes place and for separating the first inner space from the second inner space at the other portions, (d) preparing a fourth means for shielding the second means from the second space, (e) supplying an inactive gas into the second inner space, and (f) surface treating the sample in the second inner space.

The present invention further provides a surface treating apparatus which comprises the steps of (a) preparing a first means for supplying a reactive gas used for surface treating to the sample, (b) preparing a second means for heating the first means in a first inner space, (c) preparing a third means for partially communicating the first inner space with a second space where surface treating of the sample takes place and for separating the first space from the second space at the other portions, (d) preparing a fourth means for shielding the second means from the second space, (e)

evacuating the second inner space, and (f) surface treating the sample in the second inner space.

The present invention further provides a semiconductor device manufacturing method which comprises the steps of (a) preparing a first means for supplying a reactive gas used for surface treating to the semiconductor device, (b) preparing a second means for heating the first means in a first inner space, (c) preparing a third means for partially communicating the first inner space with a second space where surface treating of the semiconductor device takes place and for separating the first space from the second space at the other portions, (d) preparing a fourth means for shielding the second means from the second space, (e) supplying an inactive gas into the second inner space, and (f) surface treating the semiconductor device in the second inner space.

The present invention further provides a semiconductor device manufacturing method which comprises the steps of (a) preparing a first means for supplying a reactive gas used for surface treating to the semiconductor device, (b) preparing a second means for heating the first means in a first inner space, (c) preparing a third means for partially communicating the first inner space with a second space where surface treating of the semiconductor device takes place and for separating the first space from the second space at the other portions, (d) preparing a fourth means for shielding the second means from the second space, (e) evacuating the second inner space, and (f) surface treating the semiconductor deice in the second inner space.

The present invention further provides a surface treating apparatus which comprises a first means for supplying a reactive gas used for surface treating a sample to the sample, a second means for heating the first means, a third means for accommodating the first and second means in an inner space, and a fourth means for hermetically sealing the second means.

The present invention further provides a surface treating method which comprises the steps of (a) preparing a first means for supplying a reactive gas used for surface treating to the sample, (b) preparing a second means for heating the first means, (c) preparing a third means for accommodating the first and second means in an inner space, (d) hermetically sealing the second means, and (e) surface treating the sample in the inner space.

The present invention further provides a semiconductor manufacturing method which comprises the steps of (a) preparing a first means for supplying a reactive gas used for surface treating to the semiconductor device, (b) preparing a second means for heating the first means, (c) preparing a third means for accommodating the first and second means in an inner space, (d) hermetically sealing the second means, and (e) surface processing the semiconductor device in the inner space.

The present invention further provides a surface treating apparatus which comprises a first means having a first inner space where a sample is to be accommodated, second means for supplying a reactive gas used for surface treating the sample into the first inner space, a third means for heating the reactive gas supplied into the first inner space, a fourth means for accommodating the third means in a second inner space, and a fifth means for supplying an inactive gas into the second inner space. The first and second inner spaces are hermetically separated from each other.

The present invention further provides a surface treating apparatus which comprises a first means having a first inner space where a sample is to be accommodated, a second means for heating an reactive gas used for surface treating the sample, a third means for accommodating the second means in a second inner space, a fourth means for supplying an inactive gas into the second inner space;

a third inner space formed by an activating surface treating by the third means and a collimator, the third inner space communicating with the first inner space through the collimator, the third inner space being hermetically separated from the second inner space, and a fifth means for supplying the reactive gas into the third inner space.

The present invention further provides a surface treating apparatus which comprises a first means having a first inner space where a sample is to be accommodated, a second means for supplying a reactive gas used for surface treating the sample into the first inner space, a third means for heating the reactive gas supplied into the first inner space, a fourth means for accommodating the third means in a second inner space, and a fifth means for evacuating the second inner space. The first and second inner spaces are hermetically separated from each other.

The present invention further provides a surface treating apparatus which comprises a first means having a first inner space where a sample is to be accommodated, a second means for heating an reactive gas used for surface treating the sample, a third means for accommodating the second means in a second inner space, a fourth means for evacuating the second inner space, a third inner space formed by an activating surface treated by the third means and a collimator, the third inner space communicating with the first inner space through the collimator, the third inner space being hermetically separated from the second inner space, and a fifth means for supplying the reactive gas into the third inner space.

The present invention further provides a surface treating apparatus which comprises a first means for supplying a reactive gas used for surface treating to the sample, a second means for heating the first means, a third means for accommodating the second means in a first inner space, a fourth means for surface treating the sample in a second inner space, and a fifth means for supplying an inactive gas into the first inner space. The first and second inner spaces are hermetically separated from each other.

The present invention further provides a surface treating apparatus which comprises a first means for supplying a reactive gas used for surface treating to the sample, a second means for heating the first means, a third means for accommodating the second means in a first inner space, a fourth means for surface treating the sample in a second inner space, and a fifth means for evacuating the first inner space. The first and second inner spaces are hermetically separated from each other.

DETAILED DESCRIPTION OF THE DRAWINGS

Figure 1:
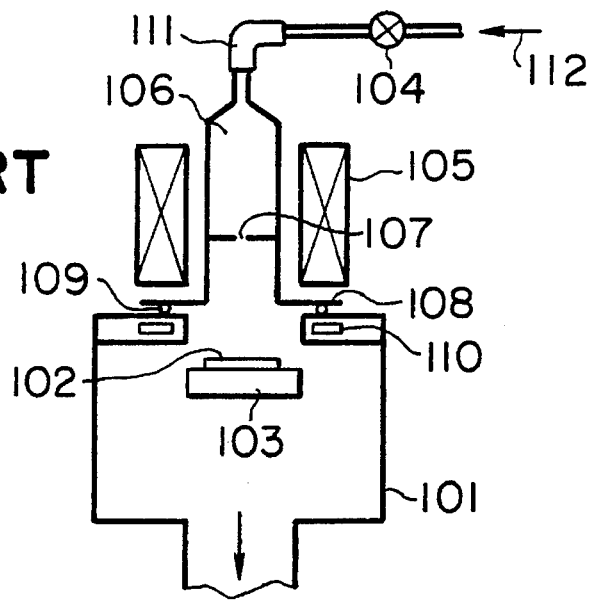
FIG. 1 shows a conventional surface treating apparatus which uses a thermally excited molecular beam.

Embodiments of the present invention will be described with reference to FIGS. 4 to 13.

First, a first embodiment will be described with reference to FIG. 4.

A reaction chamber 1 is provided with an evacuating device (not shown) for evacuating the chamber from an exhaust port 51. A sample 2 and a sample base 3 are accommodated in the reaction chamber 1. The reaction chamber 1 is made of a stainless steel from the viewpoints of strength and processability. A reactive gas 4 is introduced through a nozzle 5 from an external source. A tungsten wire 6 is wound around the portion of the nozzle 5 located several centimeters from the distal end thereof located within the reaction chamber 1 as a heat source for heating the reactive gas 4. The nozzle 5 is made of a stable substance, such as quartz. A desirable inner diameter of the nozzle 5 is from several fractions of a millimeter to several millimeters. The number of the nozzle 5 provided depends on the surface area of the sample. The reactive gas 4 is heated while it passes through the nozzle 5, and thermally excited molecules of the reactive gas 4 flows into the reaction chamber 1 in the form of a molecular beam and collide against the surface of the sample 2. A halogen gas, such as $Cl_2$ or $F_2$, or a halogen compound, such as HCl or $NF_3$, is generally used as the reactive gas 4 when etching of the sample 2 is performed. The sample 2 may be a semiconductor, such as Si or GaAs, or a metal, such as Al. In the embodiment shown in FIG. 4, the tungsten wire 6 which serves as the heating source and the reaction chamber 1 are hermetically separated from each other by means of a wall of the reaction chamber 1, a side wall 7 and a partitioning plate 8. In this embodiment, the side wall 7 is formed integrally with the reaction chamber 1, i.e., the side wall 7 is made of a stainless steel. The partitioning plate 8 is connected to the nozzle 5, that is, it is made of quartz. A packing (O-ring) 9 is provided between the side wall 7 and the partitioning plate 8. The chamber where the electric resistance heating wire 6 is provided is hermetically separated from the atmosphere by a packing 10. The chamber where the electric resistance heating wire 6 is provided is changed with an inactive gas 11, such as $N_2$ or Ar, in order to prevent reaction of the substance which constitutes the electric resistance heating wire 6 with the reactive gas 4. A water cooling tube 12 is provided on the side wall 7 to cool the side wall 7.

In the above-described surface treating apparatus, the reactive gas 4 cannot come close to the electric resistance heating wire 6 or the vicinity thereof. In this way, chemical reactive of the electric resistance heating wire 6, the inner surface of the side wall 7 or the portion of the apparatus which is heated to high temperatures, such as the electric wiring to the electric resistance heating wire 6, with the reactive gas can be prevented, and the amount of contaminating substances to the sample 2 can thus be greatly reduced.

A second embodiment of the present invention will be described below with reference to FIG. 5. In this embodiment, the chamber where the electric resistance heating wire 6 is accommodated is hermetically separated from the reaction chamber 1, and the heating source is sealed in a vacuum by evacuating the vicinity thereof through a port 52. Chemical reactions of the substance which is the composition of the electric resistance heating wire 6 with the gas present in the vicinity thereof do not occur easily due to the evacuation of the vicinity of the electric resistance heating wire 6. This elongates the life of the electric resistance heating wire 6. In FIG. 5 and the following figures, the same reference numerals are used to denote part which are the same as those shown in FIG. 4, description being omitted.

Figure 4:
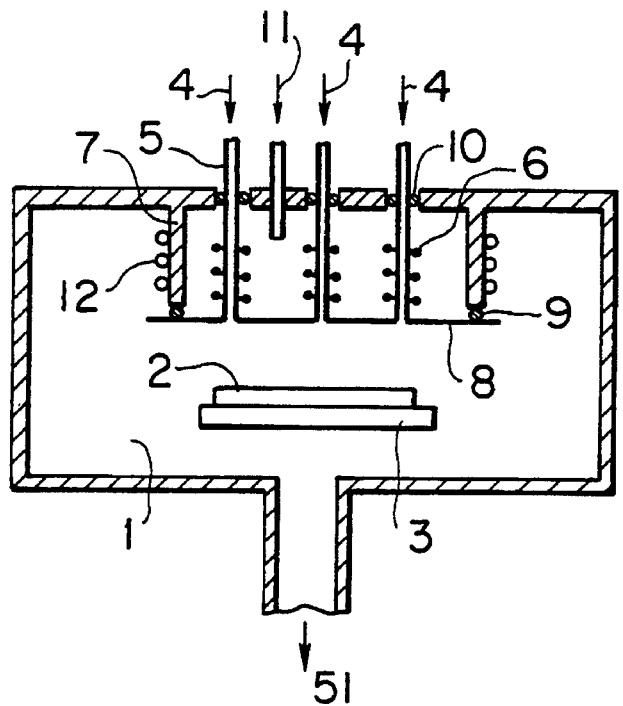
FIG. 4 is cross-sectional view of a first embodiment of the surface treating apparatus according to the present invention.
Figure 5:
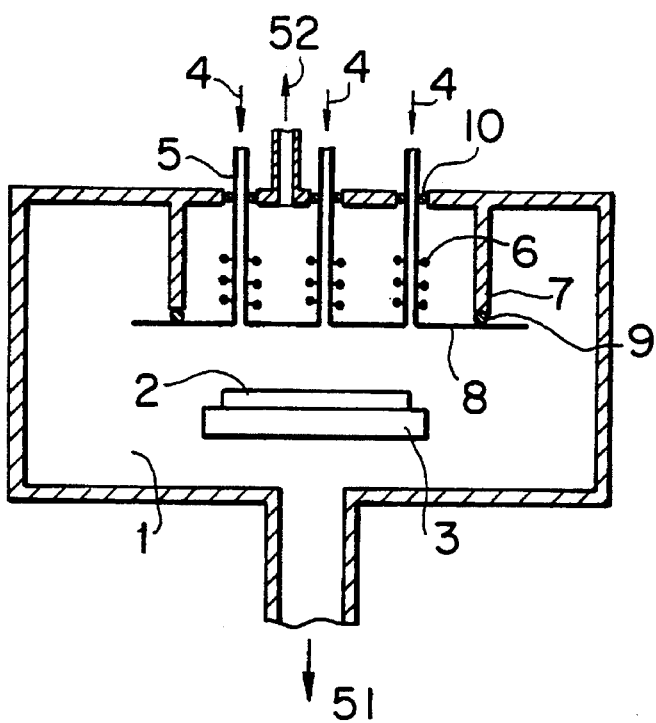
FIG. 5 is a cross-sectional view of a second embodiment of the surface treating apparatus according to the present invention.
Figure 6:
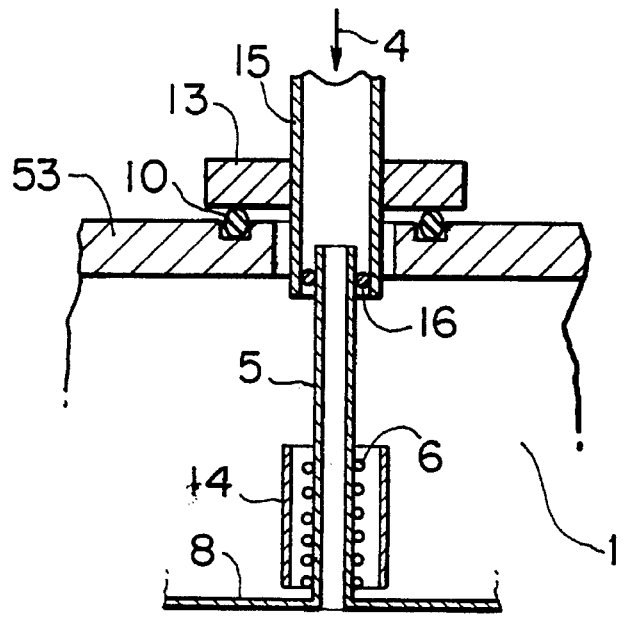
FIG. 6 shows a modification of the heating means and the vicinity thereof of the surface treating apparatus according to the present invention.

FIG. 6 is an enlarged cross-sectional view of a modification of the connected portion between the reaction chamber 1 and the nozzle 5 in the embodiment shown in FIGS. 4 or 5. The reactive gas 4 is introduced into the reaction chamber 1 from a metal tube 15 made of a stainless steel. The metal tube 15 is welded to a flange 13 which is connected to an outer wall 53 of the reaction chamber through the packing 10. The metal tube 15 is connected to the nozzle 5 made of quartz through a packing 16. In this structure, since the gas introducing portion is made of a metal, it can be made strong and be easily handled as compared with that made of quartz in the apparatus shown in FIGS. 4 or 5. An enclosure 14 made of quartz is provided around the electric resistance heating wire 6.

Figure 7:
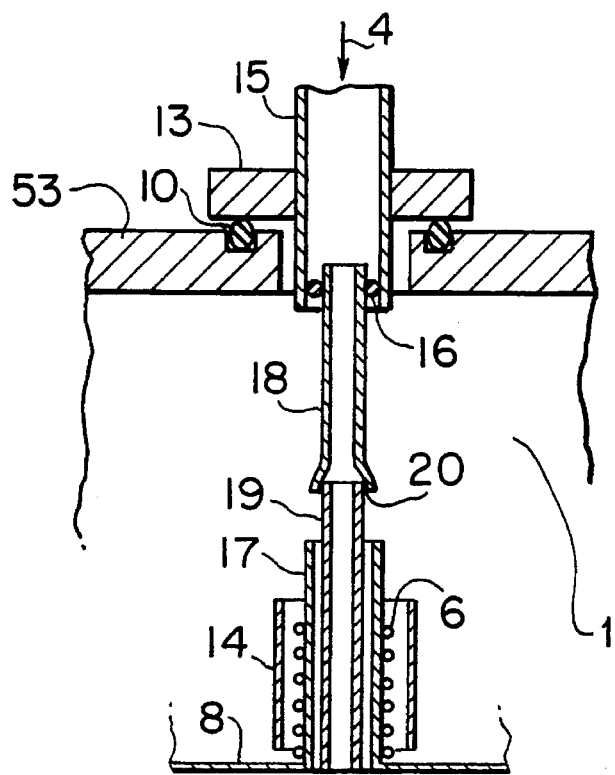
FIG. 7 shows another modification of the heating means and the vicinity thereof of the surface treating apparatus according to the present invention.

FIG. 7 is an enlarged cross-sectional view of another modification of the connected portion between the reaction chamber 1 and the nozzle 5 in the embodiment shown in FIGS. 4 or 5. In this example, a nozzle 19 and a furnace 17 around which the electric resistance heating wire 6 is wound are provided separately. Although the nozzle 19 can be made of quartz, in this example, the portion thereof heated by the electric resistance heating wire 6 is made of graphite in order to enhance absorption of heat. The nozzle 19 is connected to a quartz tube 18 through a connecting portion 20. The connection between the nozzle 19 and the quartz tube 18 is conducted using a ceramic type adhesive. In this structure, since a gap exists between the nozzle 19 and the furnace 17, hermetical sealing between the reaction chamber 1 and the chamber where the heating wire 6 is accommodated is not provided. However, if the gap is, for example, 1 mm or less and if the length of the furnace 17 is, for example, above 5 cm, the conductance of this portion is sufficiently small, and separate evacuation of the reaction chamber 1 and the chamber of the electric resistance heating wire 6 causes no problem in terms of contamination. In the structure shown in FIG. 7, since the nozzle 19 and the partitioning plate 8 can be easily removed, maintenance of the nozzle, such s repair thereof, is facilitated as compared with the case where the reaction chamber 1 and the chamber for the electric resistance heating wire 6 are separately sealed.

Figure 2:
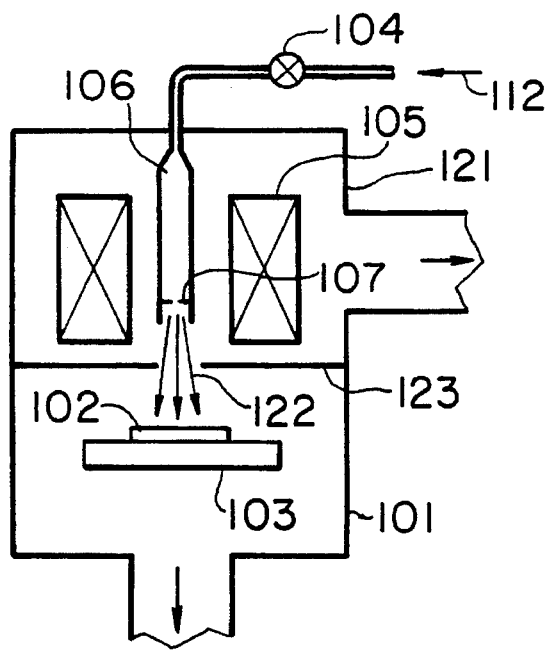
FIG. 2 shows another example of the conventional surface treating apparatus which uses a thermally excited molecular beam.
Figure 3:
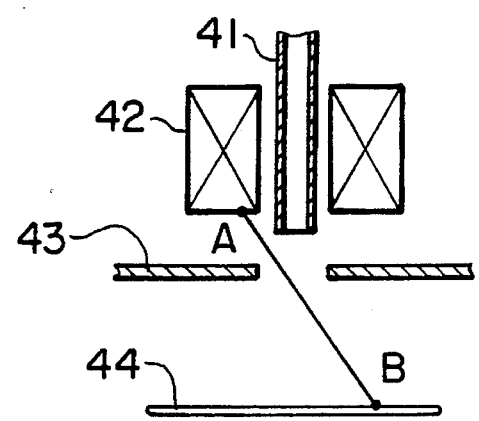
FIG. 3 shows the essential parts of the surface treating apparatus using the thermally excited molecular beam, including a nozzle and a sample.

The surface processing apparatus disclosed in the specification of the aforementioned U.S. patent, shown in FIG. 2, uses the partitioning plate having the holes through which molecular beams pass. The disadvantages of this surface treating apparatus are insufficient separation of the gas resulting from high conductance (the ease with which a gas flows) and flow of the contaminant generated in the chamber where the heating means is accommodated to the surface of the sample. That is, in the structure shown in FIG. 2, contaminating substances fly to the sample together with the molecules of the reactive gas required for surface treating, lowering the contaminant removal effect. In the structure shown in FIG. 2, the gas conductance $C_1$ of the partitioning plate having the holes is given by the following equation:

$$C_1 = 116A \quad (2)$$

where A is the area ($m^2$) of the holes.
The diameter of the hole must be made about $3 \times 10^{-3}$ m to make the beam pass therethrough. Therefore, $C_2 = 8.2 \times 10^{-4}$ $m^3$/s.

The gas conductance $C_2$ ($m^3$/s) of the coaxial cylindrical flowpassage formed by the outer diameter $d_2$ (m) of the nozzle 19 and the inner diameter $d_1$ (m) of the cylindrical furnace 17 in the structure shown in FIG. 7 is given by the following equation:

$$C_2 = 121K \frac{(d_1 - d_2)2(d_1 + d_2)}{l} \quad (1)$$

where K is the coefficient determined by $d_2/d_1$. Assuming that $d_1 = 4 \times 10^{-3}$ m, $d_2 = 2 \times 10^{-3}$ m and $l = 50 \times 10^{-3}$ m, K=1.15. Therefore, $C_2 = 3.3 \times 10^{-5}$ $m^3$/s. Thus, the conductance $C_2$ between the reaction chamber 1 and the chamber where the heating means is accommodated in the structure shown in FIG. 7 is one order in magnitude smaller than the conductance $C_1$ between the reaction chamber 1 and the chamber where the heating means is accommodated in the structure shown in FIG. 2. To achieve sufficient reduction in the degree of contamination, it is in general required that the furnace 17 be of the sheath type, that the sample 2 not facing the electric resistance heating wire 6 and that the gas conductance per beam source be $1 \times 10^{-4}$ $m^3$/s or less.

Figure 8:
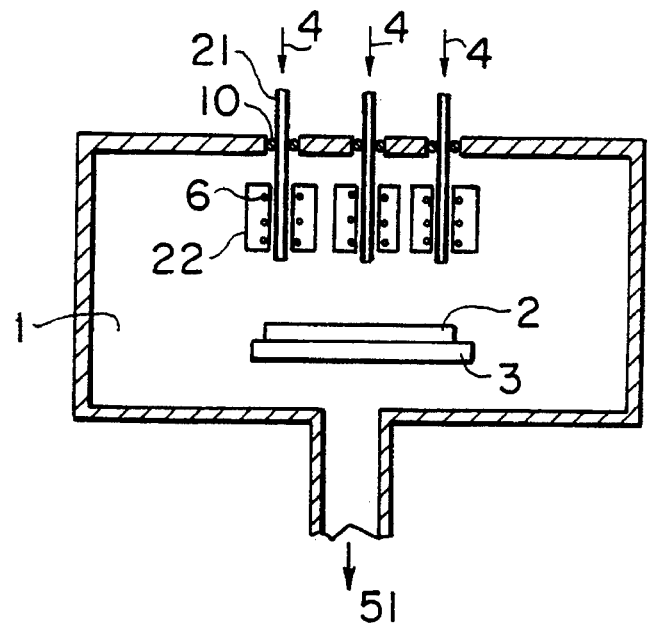
FIG. 8 is a cross-sectional view of a third embodiment of the surface treating apparatus according to the present invention.

A third embodiment of the present invention will now be described with reference to FIG. 8.

Figure 9:
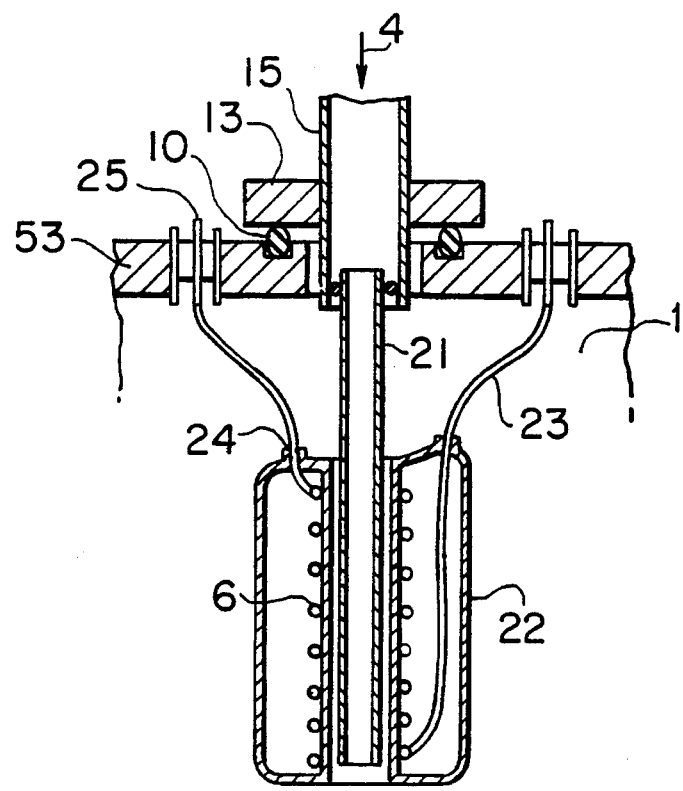
FIG. 9 shows the heating means and the vicinity thereof of the surface treating apparatus according to the present invention.

In this embodiment, to separate the heating means and the reaction chamber 1 from each other, only the electric resistance heating wire 6, serving as the heating source, is hermetically sealed. A container 22 for hermetically sealing the electric resistance heating wire 6 is constructed such that it passes a nozzle 21 therethrough at the central portion thereof. FIG. 9 is an enlarged view of the portion of the surface treating apparatus including the electric resistance heating wire container 22 of FIG. 8. In this structure, the reactive gas 4 is introduced into the reaction chamber using the metal tube 15, as in the case shown in FIG. 6. The electric resistance heating wire container 22 made of quartz or the like may be evacuated or charged with an inactive gas, such as Ar. The electric resistance heating wire container 22 has sealing portions 24 for lead wires 23. The electric resistance heating wire 6 is connected to metal wires having a low resistance, i.e., to the lead wires 23. The sealing portions 24 are directly sealed to quartz, if the lead wires 23 are made of molybdenum. If the sealing portions are made of another metals that cannot be directly sealed to quartz, intermediate glasses whose type is determined by the used metal are used.

The lead wires 23 are connected to power introducing terminals 25. In this embodiment, since the reactive gas does not collide against the electric resistance heating wire 6, flying of the contaminant to the sample can be prevented, as in the case of the aforementioned embodiments.

A fourth embodiment of the present invention will be described below with reference to FIG. 10. In this and following embodiments, the reactive gas located in the vicinity of the sample in the reaction chamber is heated by a heating source to generate thermally excited molecules, and these molecules are led to the surface of the sample in the form of a molecular beam using a collimator.

The reactive gas 4 is introduced into the reaction chamber 1. An activating surface, i.e., a heating plate 27 for heating the reactive gas 4, is provided above the surface of the sample 2 placed in the reaction chamber 1. The heating plate 27 is heated by an electric resistance heating wire 26. The reactive gas 4 collides against the activating surface 27 heated to high temperatures and is thereby thermally excited. A collimator 28 is disposed between the sample 2 and the activating surface 27. The thermally excited gas is oriented by the collimator 28 and then collides against the sample 2. In this way, etching of the same having a large area is facilitated as compared with the nozzle method shown in FIG. 4.

Figure 10:
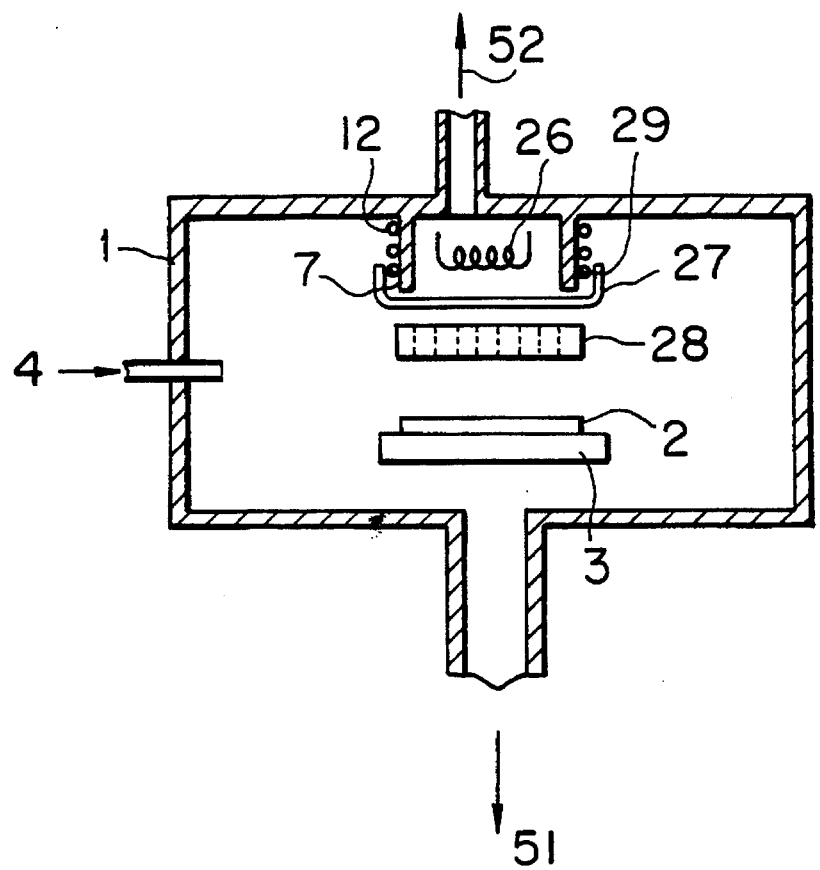
FIG. 10 is a cross-sectional view of a fourth embodiment of the surface treating apparatus according to the present invention.

In the embodiment shown in FIG. 10, the electric resistance heating wire 26 is hermetically separated from the reaction chamber 1 by means of the activating plate 27 and part of the wall of the reaction chamber 1. The chamber where the electric resistance heating wire 26 is disposed and which is hermetically separated from the reaction chamber 1 may be evacuated from a port 52 or charged with an inactive gas (not shown). In the embodiments shown in FIGS. 12 and 13, the chamber where the electric resistance heating wire 26 is accommodated is exhausted to obtain a vacuum or charged with an inactive gas.

The activating surface 27 may be made of quartz. The activating surface 27 is hermetically connected to a side wall 7 by a packing 29. The surface of the activating surface 27 which faces the electric resistance heating wire 26 may be attached with a carbon or metal film so as to enhance absorption of heat. The electric resistance heating wire 26 may be constructed by disposing an electric resistance heating wire on a flat surface or by disposing a ribbon-shaped carbon electric resistance heating wire on a ceramic. The side wall 7 is cooled by a water cooling tube 12. The reactive gas 4 does not come close to the electric resistance heating wire 26 and contamination is thus prevented.

Figure 11A:
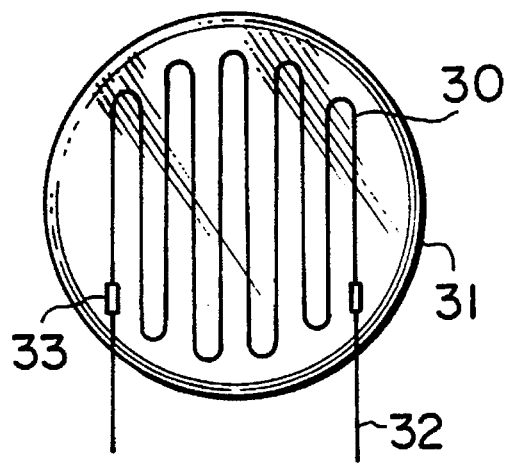
FIG. 11A shows a top view of the heating means and the vicinity thereof of the surface treating apparatus according to the present invention.
Figure 11B:
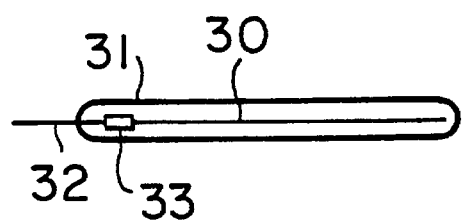
FIG. 11B shows a cross-sectional view of the heating means shown in FIG. 11A.

FIGS. 11A and 11B are respectively top and cross-sectional views showing a modification of the heating means separating structure in which an electric resistance heating wire 30, such as tungsten wire, is sealed in an electric resistance heating wire cover 31. The electric resistance heating wire cover 31 is made of quartz or ceramic. The electric resistance heating wire 30 is connected to lead wires 32 through connecting portions 33. The electric resistance heating wire cover 31 serves as the activating surface by itself.

Figure 12:
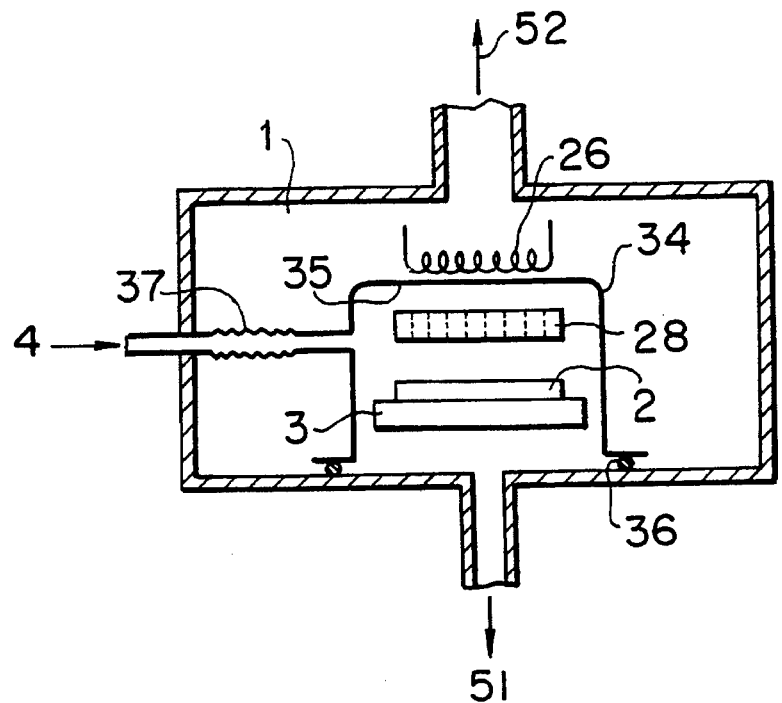
FIG. 12 is cross-sectional view of a fifth embodiment of the surface treating apparatus according to the present invention.

FIG. 12 is a cross-sectional view of a fifth embodiment of the surface treating apparatus according to the present invention. Substantially similarly to the fourth embodiment shown in FIG. 10, an inner container 34 for covering the sample 2 and the collimator 28 is provided so as to make the volume of the reactive gas small. The inner container 34 is hermetically sealed from the chamber of the electric resistance heating wire 26 by a packing 36. A flexible tube 37 is provided so that the sample can be placed or discharged from the inner container 34. In this way, a ceiling portion 35 of the inner container 34 is heated by the electric resistance heating wire 26 and serves as the activating surface.

Figure 13:
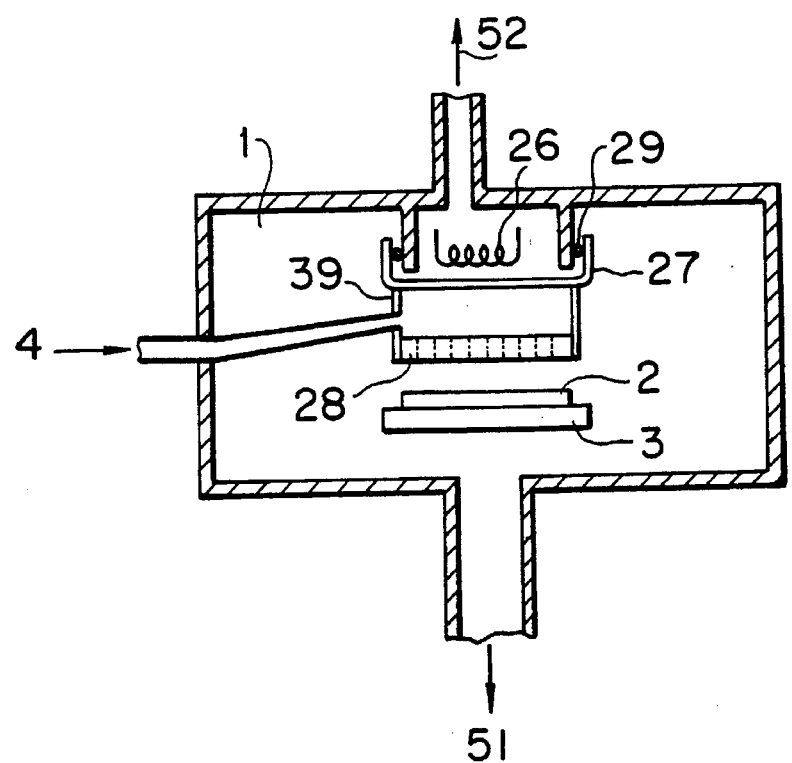
FIG. 13 is a cross-sectional view of a sixth embodiment of the surface treating apparatus according to the present invention.

FIG. 13 is a cross-sectional view of a sixth embodiment of the surface treating apparatus which has been improved from that shown in FIG. 10. In this embodiment, an enclosure 39 made of quartz or the like is provided in a space between the activating surface 27 and the collimator 28. In this way, since the reactive gas 4 enters the minimum space, contamination is further reduced. Also, heating efficiency is improved.

As will be understood from the foregoing description, in the present invention, the reactive gas does not easily come close to the heating means or the vicinity thereof. Consequently, generation of the contaminant caused by the heating means can be sufficiently reduced. Also, reduction in the surface treating rate caused by the contaminant, such as etching or oxidation rate, can be sufficiently reduced.

What is claimed is:

1. A surface treating apparatus comprising:
   a first means for supplying a reactive gas used for surface treating a sample to the sample;
   a second means for heating said first means;
   a third means for accommodating said second means in a first inner space;
   a fourth means for surface treating the sample in a second inner space; and
   a fifth means for supplying an inactive gas into said first inner space,
   wherein said first inner space is located within said second inner space, and said first inner space and a portion of said second inner space in which the sample is surface treated are hermetically separated from each other by partitioning means.

2. A surface treating apparatus according to claim 1, wherein said partitioning means includes a partitioning plate.

3. The surface treating apparatus according to claim 1, wherein said first means comprises a reactive gas supply tube.

4. The surface treating apparatus according to claim 1, wherein said fifth means comprises an inactive gas supply tube.

5. A surface treating apparatus comprising:
   a first means for supplying a reactive gas used for surface treating to the sample;
   a second means for heating said first means;
   a third means for accommodating said second means in a first inner space;
   a fourth means for surface treating the sample in a second inner space; and
   a fifth means for evacuating said first inner space,
   wherein said first inner space is located within said second inner space, and said first inner space and a portion of said second inner space in which the sample is surface treated are hermetically separated from each other by partitioning means.

6. A surface treating apparatus according to claim 5, wherein said partitioning means includes a partitioning plate.

7. The surface treating apparatus according to claim 5, wherein said first means comprises a reactive gas supply tube.

8. The surface treating apparatus according to claim 5, wherein said fifth means comprises an exhaust tube.

9. A surface treating method comprising the steps of:
   (a) preparing a first means for supplying a reactive gas used for surface treating to the sample;
   (b) preparing a second means for heating said first means in a first inner space;
   (c) supplying an inactive gas into said first inner space; and
   (d) surface treating the sample in a second inner space, wherein said first inner space is located within said second inner space, and is hermetically separated from a portion said second inner space in which the sample is surface treated by partitioning means.

10. A surface treating method according to claim 9, wherein said partitioning means includes a partitioning plate.

11. A surface treating method comprising the steps of:
    (a) preparing a first means for supplying a reactive gas used for surface treating to the sample;
    (b) preparing a second means for heating said first means in a first inner space;
    (c) evacuating said first inner space; and
    (d) surface treating the sample in a second inner space, wherein said first inner space is located within said second inner space, and is hermetically separated from a portion of said second inner space in which the sample is surface treated by partitioning means.

12. A surface treating method according to claim 11, wherein said partitioning means includes a partitioning plate.

13. A surface treating apparatus comprising:
    a first means for supplying a reactive gas used to surface treat to the sample;
    a second means for heating said first means;
    a first space where said second means is accommodated;
    a second space where surface treating of the sample takes place;
    a third means for partially communicating said first space with said second space and for separating said first space from said second space at the other portions by a partitioning plate, wherein said first space is located within said second space;
    a fourth means for preventing the sample in the second space from directly facing said second means; and
    a fifth means for supplying an inactive gas into said first space.

14. A surface treating apparatus according to claim 13, wherein a gas conductance per beam source between said second means and said sample is $1 \times 10^{-4}$ m$^3$/s or less.

15. The surface treating apparatus according to claim 13, wherein said first means comprises a reactive gas supply tube.

16. The surface treating apparatus according to claim 13, wherein said fifth means comprises an inactive gas supply tube.

17. The surface treating apparatus according to claim 13, wherein said first means extends close to the communicating portion of said third means, and wherein said second means is disposed in the vicinity of an outer peripheral portion of said first means.

18. A surface treating apparatus comprising:
    a first means for supplying a reactive gas used to surface treat to the sample;

a second means for heating said first means;

a first space where said second means, is accommodated;

a second space where surface treating of the sample takes place;

a third means for partially communicating said first space with said second space and for separating said first space from said second space at the other portions by a partitioning plate, wherein said first space is located within said second space;

a fourth means for preventing the sample in the second space from directly facing said second means; and a fifth means for evacuating said first space.

19. A surface treating apparatus according to claim 18, wherein a gas conductance per beam source between said second means and said sample is $1 \times 10^{-4}$ m³/s or less.

20. The surface treating apparatus according to claim 18, wherein said first means comprises a reactive gas supply tube.

21. The surface treating apparatus according to claim 18, wherein said fifth means comprises an exhaust tube.

22. The surface treating apparatus according to claim 18, wherein said first means extends close to the communicating portion of said third means, and wherein said second means is disposed in the vicinity of an outer peripheral portion of said first means.

23. A surface treating method comprising the steps of:

(a) preparing a first means for supplying a reactive gas used for surface treating to the sample;

(b) preparing a second means for heating said first means in a first inner space;

(c) preparing a third means for partially communication said first inner space with a second space wherein surface processing of the sample takes place and for separating said first inner space from said second inner space at the other portions by a partitioning plate, wherein said first inner space is located within said second space;

(d) preparing a fourth means for preventing the sample in the second space from directly facing said second means;

(e) supplying an inactive gas into said first inner space; and (f) surface treating the sample in said second space.

24. A surface treating method according to claim 23, wherein said fourth means provides a gas conductance per beam source between said second means and said sample of $1 \times 10^{-4}$ m³/s or less.

25. A surface treating method comprising the steps of:

(a) preparing a first means for supplying a reactive gas used for surface treating to the sample;

(b) preparing a second means for heating said first means in a first inner space;

(c) preparing a third means for partially communicating said first inner space with a second space where surface treating of the sample takes place and for separating said first space from said second space at the other portions by a partitioning plate, wherein said first inner space is located within said second space;

(d) preparing a fourth means for preventing the sample in the second space from directly facing said second means;

(e) evacuating said first inner space; and (f) surface treating the sample in said second space.

26. A surface treating means according to claim 25, wherein said fourth means provides a gas conductance per beam source between said second means and said sample of $1 \times 10^{-4}$ m³/s or less.

27. A surface treating apparatus comprising:

a first means for supplying a reactive gas used in surface treating to the sample;

a second means for heating said first means;

a third means for accommodating said first and second means in an inner space; and a fourth means for hermetically sealing said second means from a remainder of said inner space by a partitioning means.

28. A surface treating apparatus according to claim 27, wherein said partitioning means includes a container for hermetically containing said second means.

29. The surface treating apparatus according to claim 27, wherein said first means comprises a reactive gas supply tube.

30. A surface treating method comprising the steps of:

(a) preparing a first means for supplying a reactive gas used for surface treating to the sample;

(b) preparing a second means for heating said first means;

(c) preparing a third means for accommodating said first and second means in an inner space;

(d) hermetically sealing said second means from a remainder of said inner space; by partitioning means; and (e) surface treating the sample in said inner space.

31. A surface treating method according to claim 30, wherein said partitioning means includes a container for hermetically containing said second means.

32. A surface treating apparatus comprising:

a first means having a first inner space where a sample is to be accommodated;

a second means for supplying a reactive gas used for surface treating the sample into said first inner space;

a third means for heating the reactive gas supplied into said first inner space;

a fourth means for accommodating said third means in a second inner space; and a fifth means for supplying an inactive gas into said second inner space, wherein said second inner space is located within said first inner space, and a portion of said first inner space in which the sample is to be accommodated and said second inner space are hermetically separated from each other by partitioning means.

33. A surface treating apparatus according to claim 32, wherein said partitioning means comprises a heating plate.

34. The surface treating apparatus according to claim 32, wherein said third means comprises a heating plate.

35. The surface treating apparatus according to claim 32, wherein a collimator is accommodated in said first inner space.

36. The surface treating apparatus according to claim 32, wherein said second means comprises a reactive gas supply tube.

37. The surface treating apparatus according to claim 32, wherein said fifth means comprises an inactive gas supply tube.

38. A surface treating apparatus comprising:

a first means having a first inner space where a sample is to be accommodated;

a second means for heating an reactive gas used for surface treating the sample;

a third means for accommodating said second means in a second inner space;

a fourth means for supplying an inactive gas into said second inner space;

a third inner space formed by partitioning means, the partitioning means comprising a heating plate treated by said third means and a collimator, said third inner space communicating with said first inner space through said collimator, said second and third inner spaces being located within said first inner space, and third inner space being hermetically separated from said second inner space by said heating plate; and a fifth means for supplying the reactive gas into said third inner space.

39. A surface treatment apparatus according to claim 38, wherein said partitioning means further comprises an enclosure for sealing said third inner space from said first inner space such that said third inner space communicates with a portion of said first inner space in which the sample is to be accommodated only through said collimator.

40. The surface treating apparatus according to claim 38, wherein said fourth means comprises an inactive gas supply tube.

41. The surface treating apparatus according to claim 38, wherein said fifth means comprises a reactive gas supply tube.

42. A surface treating apparatus comprising:

a first means having a first inner space where a sample is to be accommodated;

a second means for supplying a reactive gas used for surface treating the sample into said first inner space;

a third means for heating the reactive gas supplied into said first inner space;

a fourth means for accommodating said third means in a second inner space; and a fifth means for evacuating said second inner space, wherein said second inner space is located within said first inner space, and a portion of said first inner space in which the sample is to be accommodated and said second inner space are hermetically separated from each other by partitioning means.

43. A surface treating apparatus according to claim 42, wherein said partitioning means includes a heating plate.

44. The surface treating apparatus according to claim 42, wherein said third means comprises a heating plate.

45. The surface treating apparatus according to claim 42, wherein a collimator is accommodated in said first inner space.

46. The surface treating apparatus according to claim 42, wherein said second means comprises a reactive gas supply tube.

47. The surface treating apparatus according to claim 42, wherein said fifth means comprises an exhaust tube.

48. A surface treating apparatus comprising:

a first means having a first inner space where a sample is to be accommodated;

a second means for heating an reactive gas used for surface treating the sample;

a third means for accommodating said second means in a second inner space;

a fourth means for evacuating said second inner space;

a third inner space formed by partitioning means, the positioning means comprising a heating plate treated by said third means and a collimator, said third inner space communicating with said first inner space through said collimator, said second and third inner spaces being located within said first inner space, and third inner space being hermetically separated from said second inner space by said heating plate; and a fifth means for supplying the reactive gas into said third inner space.

49. A surface treatment apparatus according to claim 48, wherein said partitioning means further comprises an enclosure for sealing said third inner space from said first inner space such that said third inner space communicates with a portion of said first inner space in which the sample is to be accommodated only through said collimator.

50. The surface treating apparatus according to claim 48, wherein said fourth means comprises an exhaust tube.

51. The surface treating apparatus according to claim 48, wherein said fifth means comprises a reactive gas supply tube.

52. A surface treating apparatus comprising:

a first means for supplying a reactive gas used for surface treating to the sample;

a second means for heating said first means;

a third means for accommodating said second means in a first inner space;

a fourth means for surface treating the sample in a second inner space; and a fifth means for supplying an inactive gas into said first inner space, wherein said second inner space is located within said first inner space, and a portion of said first inner space in which said second means are accommodated and said second inner space are hermetically separated from each other by partitioning means.

53. A surface treating apparatus according to claim 52, wherein said partitioning means includes an inner container provided within said first inner space for defining said inner space.

54. The surface treating apparatus according to claim 52, wherein a collimator is accommodated in said second inner space.

55. The surface treating apparatus according to claim 52, wherein said first means comprises a reactive gas supply tube.

56. The surface treating apparatus according to claim 52, wherein said fifth means comprises an inactive gas supply tube.

57. A surface treating apparatus comprising:

a first means for supplying a reactive gas used for surface processing to the sample;

a second means for heating said first means;

a third means for accommodating said second means in a first inner space;

a fourth means for surface treating the sample in a second inner space; and a fifth means for evacuating said first inner space, wherein said second inner space is located within said first inner space, and a portion of said first inner space in which said second means are accommodated and said second inner space are hermetically separated from each other by partitioning means.

58. A surface treating apparatus according to claim 57, wherein said partitioning means includes an inner container provided within said first inner space for defining said second inner space.

59. The surface treating apparatus according to claim 57, wherein a collimator is accommodated in said second inner space.

60. The surface treating apparatus according to claim 57, wherein said first means comprises a reactive gas supply tube.

61. The surface treating apparatus according to claim 57, wherein said fifth means comprises an exhaust tube.

62. A surface treating apparatus, comprising:

a reaction chamber having a sample base provided therein;

an evacuating device for evacuating said reaction chamber;

at least one nozzle for introducing a reactive gas into said reactive chamber for treating a surface of a sample disposed on said sample base;

at least one heating wire for heating said reactive gas, said heating wire being provided within said reaction chamber; and partitioning means for hermetically separating said at least one heating wire and said sample base from each other.

63. A surface treating apparatus according to claim 62, wherein said partitioning means comprises an inner container within which said sample base is provided.

64. A surface treating apparatus according to claim 62, wherein said at least one heating wire is wound around said at least one nozzle at a portion adjacent a distal end of said nozzle in said reaction chamber.

65. A surface treating apparatus according to claim 64, wherein said at least one heating wire and said portion of said at least one nozzle around which said at least one heating wire is wound are provided within an inner space within said reaction chamber hermetically separated from a remainder of said reaction chamber, said sample base being provided in said remainder of said reaction chamber by said partitioning means.

66. A surface treating apparatus according to claim 65, further comprising a passage for providing an inactive gas into said inner space.

67. A surface treating apparatus according to claim 65, further comprising an evacuating device for evacuating said inner space separately from said remainder of said reaction chamber.

68. A surface treating apparatus according to claim 65, wherein said partitioning means comprises a partitioning plate.

69. A surface treating apparatus according to claim 62, wherein said partitioning means comprises at least one container, and said at least one heating wire is provided hermetically sealed in said at least one container, each of said at least one nozzle passing through a central portion of each of said at least one container.

70. A surface treating apparatus according to claim 62, wherein said partitioning means comprises a heating plate, and said at least one heating wire is provided within an inner space hermetically separated from said sample base by said heating plate and wherein said apparatus further comprises a collimator for orienting reactive gas thermally excited by said heating plate and for directing thermally excited reactive gas towards said sample base.

71. A surface treating apparatus according to claim 70, further comprising a passage for providing an inactive gas into said inner space.

72. A surface treating apparatus according to claim 65, further comprising an evacuating device for evacuating said inner space separately from remainder of said reaction chamber.

73. A surface treating apparatus, comprising:

a reaction chamber having a sample base provided therein;

an evacuating device for evacuating said reaction chamber;

at least one nozzle for introducing a reactive gas into said reactive chamber for treating a surface of a sample disposed on said sample base;

at least one heating wire for heating said reactive gas, said heater being provided within said reaction chamber; and means for separating said sample base from said at least one heating wire by a partitioning plate such that said sample base does not directly face said at least one heating wire and gas conductance therebetween per nozzle is $1 \times 10^{-4}$ m$^3$/s or less.

* * * * *